(12) United States Patent
Lee et al.

(10) Patent No.: US 7,118,965 B2
(45) Date of Patent: Oct. 10, 2006

(54) METHODS OF FABRICATING NONVOLATILE MEMORY DEVICE

(75) Inventors: Sang Bum Lee, Incheon (KR); Jin Hyo Jung, Bucheon-si (KR); Sung Woo Kwon, Anyang-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,194

(22) Filed: Dec. 29, 2004

(65) Prior Publication Data

US 2005/0142757 A1    Jun. 30, 2005

(30) Foreign Application Priority Data

Dec. 31, 2003    (KR) .................. 10-2003-0101301

(51) Int. Cl.
*H01L 21/336* (2006.01)

(52) U.S. Cl. .................. 438/258; 438/275; 438/289

(58) Field of Classification Search ................ 438/257, 438/258, 275, 289
See application file for complete search history.

(56) References Cited

U.S. PATENT DOCUMENTS

| | | | |
|---|---|---|---|
| 6,281,089 B1 * | 8/2001 | Chen | 438/315 |
| 6,362,049 B1 * | 3/2002 | Cagnina et al. | 438/258 |
| 6,458,642 B1 | 10/2002 | Yeh et al. | |
| 6,703,670 B1 * | 3/2004 | Lines | 257/392 |
| 6,787,419 B1 | 9/2004 | Chen et al. | |
| 6,803,284 B1 | 10/2004 | Hwang | |
| 6,815,274 B1 * | 11/2004 | Hsieh et al. | 438/180 |
| 2002/0016081 A1 * | 2/2002 | Aloni et al. | 438/714 |
| 2002/0127799 A1 * | 9/2002 | Kim | 438/257 |
| 2003/0151109 A1 * | 8/2003 | Taniguchi et al. | 257/500 |

* cited by examiner

*Primary Examiner*—Trung Dang
(74) *Attorney, Agent, or Firm*—Finnegan, Henderson, Farabow, Garrett, & Dunner, L.L.P.

(57) ABSTRACT

A fabricating method of a nonvolatile memory device is disclosed. A disclosed method comprises: implanting ions into an active region of a semiconductor substrate to form a well of a low voltage transistor and adjust its threshold voltage; implanting ions into an active region of the semiconductor substrate to form a well of a high voltage transistor and adjust its threshold voltage, thereby forming a conductive region; depositing an ONO layer on the semiconductor substrate; patterning and etching the ONO layer to form an ONO structure; and forming a gate oxide layer on the semiconductor substrate.

3 Claims, 1 Drawing Sheet

METHODS OF FABRICATING NONVOLATILE MEMORY DEVICE

BACKGROUND OF THE INVENTION

1. Field of the Invention

The present invention relates generally to a method of fabricating a memory device and, more particularly, to a method of fabricating a nonvolatile memory device which forms a structure for operating silicon-oxide-nitride-oxide semiconductor(hereinafter referred to as "SONOS") cells before a logic circuit is fabricated, not affecting characteristics of an existing logic circuit.

2. Background of the Related Art

In general, there are two categories in semiconductor devices, namely, a volatile memory and a non-volatile memory. The volatile memory again includes a dynamic random access memory (hereinafter referred to as "DRAM") and a static DRAM (hereinafter referred to as "SDRAM"). One characteristic of the volatile memory is that data are maintained just while electric power is being applied. In other words, when power is turned off, the data in the volatile memory disappear. On the other hands, the non-volatile memory, mainly a ROM (Read Only Memory), can keep the data regardless of the application of electric power.

From the point of a view of the fabrication process, the non-volatile memory is divided into a floating gate type and a metal insulator semiconductor (hereinafter referred to as "MIS") type. The MIS type has doubly or triply deposited dielectric layers which comprise at least two kinds of dielectric materials.

The floating gate type stores data using potential wells, and is represented by an ETOX (Electrically erasable programmable read only memory Tunnel OXide) used in a flash EEPROM (Electrically Erasable Programmable Read Only Memory).

The MIS type performs the program operation using traps at a bulk dielectric layer, an interface between dielectric layers, and an interface between a dielectric layer and a semiconductor. A Metal/Silicon ONO Semiconductor (hereinafter referred to as "MONOS/SONOS") structure mainly used for the flash EEPROM is a representative MIS structure.

A conventional SONOS memory device comprises a tunnel oxide layer, a trap nitride layer and a block oxide layer on a P-type silicon substrate, and a gate deposited thereon.

In the SONOS memory device, a program operation is performed by FN (Fowler-Nordheim) tunneling or directly tunneling electrons so that the electrons are trapped at a predetermined site in the trap nitride layer, thereby increasing a threshold voltage. An erase operation also moves the electrons by various tunneling ways such as the FN tunneling, the direct tunneling, and trap assisted tunneling so that the electrons are withdrawn to the P-type silicon substrate, thereby decreasing the threshold voltage.

However, the conventional memory devices comprising SONOS cells entirely affect, particularly when SONOS cells are fabricated, characteristics of fabricating process of a logic circuit, which means that additional circuit verification steps such as parameter measurement by SPICE (simulation program with integrated circuit emphasis) are required.

SUMMARY OF THE INVENTION

Accordingly, the present invention is directed to a method of fabricating a nonvolatile memory device that substantially obviates one or more problems due to limitations and disadvantages of the related art.

An object of the present invention is to provide a nonvolatile memory device which doesn't affect characteristics of an existing logic circuit by forming a structure for operating SONOS cells before a logic circuit is fabricated.

To achieve these objects and other advantages and in accordance with the purpose of the invention, as embodied and broadly described herein, a method of fabricating a nonvolatile memory device comprises: implanting ions into an active region of a semiconductor substrate to form a well of a low voltage transistor and adjust its threshold voltage; implanting ions into an active region of the semiconductor substrate to form a well of a high voltage transistor and adjust its threshold voltage and forming a conductive region; depositing an ONO layer on the semiconductor substrate; patterning and etching the ONO layer, and forming an ONO structure; and forming a gate oxide layer on the semiconductor substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
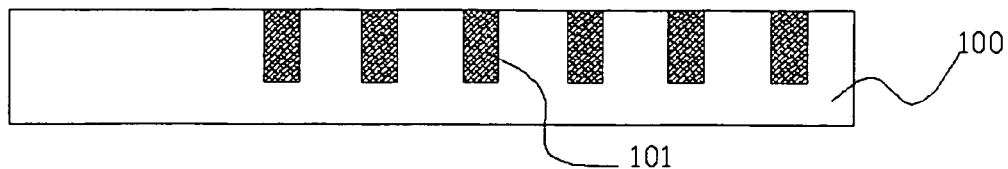
FIGS. 1a through 1d are cross-sectional views illustrating example processes of fabricating a nonvolatile memory device according to an embodiment of the present invention.

Referring to FIG. 1a, first, ions are implanted into an active region of a semiconductor substrate 100 to adjust a threshold voltage of a low voltage transistor. Next, after ions are implanted into the substrate to form a well of a high voltage transistor and to adjust its threshold voltage, conductive regions 101 are formed.

Figure 1B:
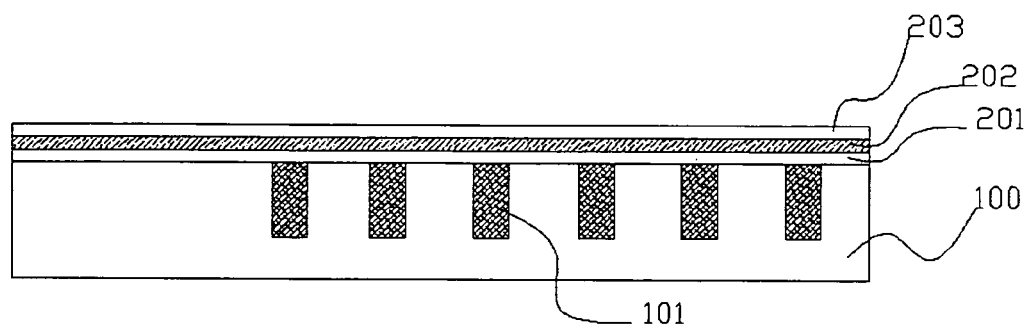

Referring to FIG. 1b, a tunnel oxide layer 201, a trap nitride layer 202 and a block oxide layer are sequentially deposited on the substrate.

Figure 1C:
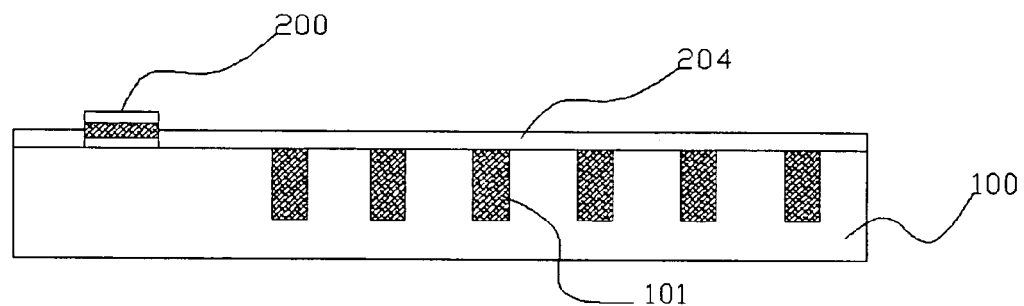

Referring to FIG. 1c, as an oxide-nitride-oxide(hereinafter referred to as "ONO") layer is patterned and wet etched, an ONO structure 200 is formed before a logic circuit is fabricated. A high voltage gate oxide layer 204 is then formed through a thermal oxidation process.

Figure 1D:
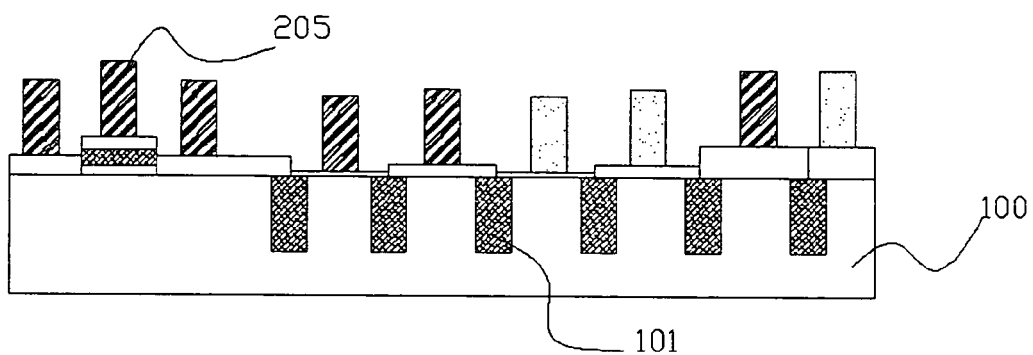

Referring to FIG. 1d, ions are implanted to form a well and adjust a threshold voltage of a low voltage transistor (preferably 2.5V transistor) and a high voltage transistor (preferably 3.3V transistor) of an NMOS(negative-channel metal oxide semiconductor) type. Next, ions are implanted to form a well and adjust a threshold voltage of a low voltage transistor and a high voltage transistor of a PMOS(positive-channel metal oxide semiconductor) type. Then, the high voltage gate oxide layer exiting where the low voltage transistor and the high voltage transistor are formed is removed. Therefore, a gate oxide layer for the high voltage transistor is formed and the gate oxide layer of the high voltage transistor existing where a low voltage transistor is formed is removed by a patterning process. Then, a gate oxide layer for the low voltage transistor is formed.

Finally, polysilicon is deposited on the gate oxide layer and doped by implanting ions, so that a gate 205 is formed.

Accordingly, the disclosed methods, by forming a structure for operating SONOS cells before a logic circuit is fabricated, embody a nonvolatile memory device with embedded SONOS cell structure, not affecting characteristics of an existing logic circuit.

It is noted that this patent claims priority from Korean Patent Application Serial Number 10-2003-0101301, which was field on Dec. 31, 2003, and is hereby incorporated by reference in its entirety.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a nonvolatile memory device comprising:
    forming a nonvolatile memory structure, including:
        implanting first ions into an active region of a semiconductor substrate to form a first well and to adjust a threshold voltage of a low voltage n-type MOS transistor and a threshold voltage of a high voltage n-type MOS transistor;
        implanting second ions into active region of the semiconductor substrate to form a second well and to adjust a threshold voltage of a high voltage p-type MOS transistor and a threshold voltage of a low voltage p-type MOS transistor, thereby forming a conductive region;
        depositing an ONO layer on the semiconductor substrate;
        patterning and etching the ONO layer to form an ONO structure;
        after forming the ONO structure, forming a first gate oxide layer on the semiconductor substrate;
        removing the first gate oxide layer existing where the low voltage n-type MOS transistor and the low voltage p-type MOS transistor are to be formed; and
        forming a second gate oxide layer for the low voltage n-type MOS transistor and the low voltage p-type MOS transistor; and
    after forming the nonvolatile memory structure, forming a logic circuit.

2. A method as defined by claim 1, wherein the ONO structure is formed by patterning and wet etching the ONO layer.

3. A method as defined by claim 1, wherein the formation of the gate oxide layer includes a thermal oxidation process.

* * * * *